United States Patent [19]
Te

[11] Patent Number: 5,923,610
[45] Date of Patent: Jul. 13, 1999

[54] TIMING SCHEME FOR MEMORY ARRAYS

[75] Inventor: Sintiat Te, San Jose, Calif.

[73] Assignee: Advanced Array Corp., San Jose, Calif.

[21] Appl. No.: 08/957,518

[22] Filed: Oct. 24, 1997

[51] Int. Cl.[6] .................................................. G11C 7/00
[52] U.S. Cl. .............................. 365/230.08; 365/230.01; 365/230.06; 365/233.5
[58] Field of Search ........................... 365/233.5, 230.01, 365/230.06, 230.08, 233

[56] References Cited

U.S. PATENT DOCUMENTS

| | | | |
|---|---|---|---|
| 5,226,139 | 7/1993 | Fujishima et al. | 395/425 |
| 5,274,596 | 12/1993 | Watanabe | 365/203 |
| 5,335,206 | 8/1994 | Kawamoto | 365/233.5 |
| 5,521,878 | 5/1996 | Ohtani et al. | 365/233 |
| 5,588,130 | 12/1996 | Fujishima et al. | 395/445 |
| 5,764,576 | 6/1998 | Hidaka et al. | 365/230.06 |

*Primary Examiner*—Viet Q. Nguyen
*Attorney, Agent, or Firm*—William L. Paradice, III

[57] ABSTRACT

A DRAM includes a data input buffer having a first input terminal coupled to data I/O pins, a second input terminal coupled to a column address buffer, a third input terminal coupled to a column address strobe buffer, and an output terminal coupled to a column decoder. When reading a selected cell of the DRAM, the first row address and the first column address are latched on the falling edge of the row address strobe signal from the address input pins into a row address buffer and from the I/O pins into the data input buffer, respectively, of the DRAM. While the row address is decoded and used to select a row of memory cells of the DRAM, the column address is decoded and used to select one of the cells from the selected row. Data corresponding to the selected cell is forwarded to the I/O pins on the first falling edge of the column address strobe signal. By latching both the first row address and the first column address on the falling edge of the row address strobe signal, the access time of the first column address is hidden.

7 Claims, 7 Drawing Sheets

5,923,610

TIMING SCHEME FOR MEMORY ARRAYS

BACKGROUND

1. Field of Invention

This invention relates generally to memory arrays and specifically to timing sequences for DRAM arrays.

2. Description of Related Art

Developed as a less expensive alternative to Static RAM (SRAM), dynamic RAM (DRAM) is presently used as the main memory of most computer systems and accounts for nearly 70% of the global semiconductor memory market. Since DRAM is much slower than SRAM, the cost savings realized by employing DRAM as main memory must be balanced with the slower speeds of DRAM. In particular, it is desirable to minimize the speed mismatch between the microprocessor and the main memory of a computer system. Otherwise, the effective rate at which the microprocessor processes information is undesirably limited by the speed of main memory, i.e., DRAM.

In order to improve this speed mismatch between the microprocessor and main memory, most computer systems include a small SRAM cache memory between the microprocessor and main memory. The cache memory stores information most frequently used by the microprocessor. When information requested by the microprocessor is stored within cache memory, the information is quickly retrieved without having to access main memory. In this manner, latency delays associated with DRAM may be hidden, thereby increasing the data rate with which the microprocessor processes information.

Presently, microprocessor speeds are increasing at a much faster rate than are DRAM speeds. Indeed, while today's microprocessors can operate at speeds exceeding 666 MHZ, DRAM speeds remain below 100 Mhz. While the use of cache memory increases the data rate of an associated microprocessor, cache memory size is limited by the high cost of SRAM. Accordingly, merely increasing the size of cache memory to compensate for the widening speed mismatch between microprocessors and DRAM is not commercially feasible. Therefore, there is a ever-increasing need to improve the speed of DRAM.

A conventional DRAM includes one or more arrays of cells arranged in columns and rows. Externally generated addresses specifying the location of a cell desired to be read from or written to are provided to the DRAM via input address lines. To read the contents of a selected cell in a DRAM array, the row address of the selected cell is clocked into a row address buffer on the falling edge of a row address strobe $\overline{RAS}$ signal. The contents of all cells within the row specified by the row address are latched into a bank of associated sense amplifiers. The column address of the selected cell is then clocked into a column address buffer on the falling edge of a column address strobe $\overline{CAS}$ signal. The column address selects a sense amplifier that corresponds to the selected cell. In response thereto, the contents of the selected sense amplifier is forwarded to an output buffer, thereby allowing the binary state of the selected cell to be read.

Data is written to DRAM in a similar manner. To write data to a selected cell, the row address is clocked on the falling edge of the $\overline{RAS}$ signal, thereby loading the contents of a selected row of cells into associated sense amplifiers. Data is then provided to an input buffer via associated input pins. The column address of the selected cell is clocked on the falling edge of the $\overline{CAS}$ signal. Data held within the input buffer is then latched into the sense amplifiers which correspond to the cell or cells selected for writing. The contents of the sense amplifiers are then written into the corresponding row of cells during a refresh operation.

The most commonly used DRAM is the extended data out (EDO) DRAM. Referring now to FIG. 1, a x16 EDO DRAM 10 includes sixteen arrays 12 each containing memory cells arranged in 512 rows by 512 columns. Each array 12 has associated therewith a row decoder 14 and an I/O gating circuit 16. Each row decoder 14 is coupled to the 512 rows of an associated array 12 via word lines 18. Each gating circuit 16 includes 512 sense amplifiers coupled to respective columns of an associated array 12 via bit lines 20. Each gating circuit 16 is coupled to an associated one of column decoders 22 via lines 24. An input buffer 26 stores data to be written into selected cells of the arrays 12, and an output buffer 28 stores data read from selected cells of the arrays 12. A refresh controller 32 and a refresh counter 34 periodically refresh data stored within the memory cells of the DRAM 10 in a well known manner. A row address strobe buffer 36 provides the $\overline{RAS}$ signal to the row address buffers 38, to the column address buffers 40, and to the refresh controller 32. A column address strobe buffer 42 provides the $\overline{CAS}$ signal to the column address buffers 40, to the refresh controller 32, to the input buffer 26, and to the output buffer 28. A control buffer 44 provides write enable ($\overline{WE}$) and output enable ($\overline{OE}$) signals to the input buffer 26 and to the output buffer 28. Signals $\overline{WE}$ and $\overline{OE}$ select the DRAM 10 for writing operations and read operations, respectively.

A cell selected for reading is addressed using 18 externally generated address bits received on the input address pins A0–A8, as follows. Referring also to the timing diagram of FIG. 2, the first 9 bits of the address, which constitute the row address of the selected cell, are held on the input pins A0–A8 until the row address stabilizes, i.e., become valid, as indicated by $\tau_{ASR}$. The $\overline{RAS}$ signal goes low and latches the row address bits held on the input pins A0–A8 into the row address buffers 38, as indicated by ROW ADDR (1) in FIG. 2. The row address bits are held on the input pins A0–A8 until the $\overline{RAS}$ signal stabilizes, as indicated by $\tau_{RAH}$. The row address then is provided to row decoders 14 which, in turn, select one of word lines 18. The contents of the cells associated with the selected word line 18 are forwarded into corresponding sense amplifiers of the gating circuits 16 via the bit lines 20.

The next 9 bits of the address, which constitute the column address of the selected cell, are provided to the input pins A0–A8 and held until valid, as indicated by $\tau_{ASC}$. The $\overline{CAS}$ signal goes low and latches the column address bits into the column address buffers 40, as indicated by COL ADDR (1) in FIG. 2. The time lapsed between the time at which the row address becomes valid and the time at which the column address become valid is called the $\overline{RAS}$ to $\overline{CAS}$ signal delay and is given by $\tau_{RCD}$. The column address bits are held on the input pins A0–A8 until the $\overline{CAS}$ signal stabilizes, as indicated by $\tau_{CAH}$. The column address bits are then provided to the column decoder 18 which, in response thereto, selects the sense amplifier of the gating circuits 16 which corresponds to the selected cell.

The data stored within the selected sense amplifier is provided to the output buffer 28 and thereafter appears as output data on the output pins DQ[0:15], as indicated by DATA-OUT(1) in FIG. 2. The time lapsed between the latching of the column address and the corresponding data appearing on the output pins DQ[0:15] is called the access time from the $\overline{CAS}$ signal, as indicated by $\tau_{CAC}$, the time lapsed between the latching of the row address and the corresponding data appearing on the output pins DQ[0:15] is called the access time from the $\overline{RAS}$ signal, as indicated by $\tau_{RAC}$, and the time lapsed between the column address appearing on the input pins A0–A8 and the corresponding data appearing on the output pins DQ[0:15] is called the access time from the column address, as indicated by $\tau_{AA}$.

After data from the selected cell is read, the $\overline{CAS}$ signal goes high, as shown in FIG. 2. A second externally generated 9-bit column address is provided to pins A0–A8 and allowed to stabilize, as indicated by $\tau_{ASC}$. The next falling edge of the $\overline{CAS}$ signal latches the second column address into the column address buffers 40, as indicated by COL ADDR (2) in FIG. 2. The time lapsed between falling edges of the $\overline{CAS}$ signal is called the $\overline{CAS}$ signal cycle time, as indicated by $\tau_{PC}$. Data corresponding to the second column address appears on the output pins DQ[0:15] a time $I_{CAC}$ after the second falling edge of the $\overline{CAS}$ signal, as indicated by DATA-OUT (2).

This process continues until each cell within the row of cells selected by the first row address has been read. A new row address may then be provided to the input pins A0–A8 on the next falling edge of the $\overline{RAS}$ signal, thereby selecting a new row of cells to be read. Cycling the $\overline{CAS}$ signal while holding the $\overline{RAS}$ signal low allows the bits of a selected row of memory to be randomly accessed without having to latch a new row address. In this manner, only one row address set-up and hold time is required to read an entire row of data from the arrays 12.

Data is written to selected cells of the DRAM 10 in a similar manner. The new data is provided on the I/O pins DQ[0:15] and then latched into the data-in buffer 26 on the falling edge of the $\overline{CAS}$ signal. After the contents of the selected row are latched into corresponding sense amplifiers of the gating circuits 16, as described above, the falling edge of the $\overline{CAS}$ signal latches the first column address and, in response thereto, data stored within the data-in buffer 26 is clocked into the sense amplifier which corresponds to the selected cell. Second data is then latched into the input buffer 26 on the second falling edge of the $\overline{CAS}$ signal. The next falling edge of the $\overline{CAS}$ signal latches the second column address which, in turn, results in the second data being latched into the sense amplifier which corresponds to the cell selected by the second column address. This process continues until data within each of the sense amplifiers corresponding to the selected row has been replaced with data stored in the input buffer 26. Data within the sense amplifiers is written to the selected row of cells during a subsequent write operation.

The access speed of the DRAM 10 may be increased by including a burst counter 52, as illustrated by DRAM 50 in FIG. 3. The burst counter 52 has an input terminal coupled to receive a column address latched from the input pins A0–A8, and has an output terminal coupled to the column decoders 22. When the burst counter 52 is not enabled, the DRAM 50 operates in page mode, i.e., in a manner identical to the DRAM 10. When the burst counter 52 is enabled, DRAM 50 operates in burst mode, as follows. An externally generated row address is latched from the input pins A0–A8 on the falling edge of the $\overline{RAS}$ signal, as described above, and data from a row of cells is latched into associated sense amplifiers of the gating circuits 16.

On the falling edge of the $\overline{CAS}$ signal, an externally generated column address is latched from input pins A0–A8 into the column address buffers 40, as described above. The column address is forwarded to the burst counter 52 and to the column decoders 22. The burst counter 52 is initialized to the column address, and the column decoders 22 select one of the sense amplifiers within the gating circuits 16, thereby causing data stored within the cell selected by the first column address to appear on the output pins A0–A8, as indicated by DATA-OUT (1) in FIG. 4.

When the $\overline{CAS}$ signal goes high, the burst counter 52 increments one memory address location, thereby internally generating a second column address. On the next falling edge of the $\overline{CAS}$ signal, the burst counter 52 provides the second column address to the column decoders 22 which, in turn, cause data stored within the cell selected by the second column address to appear as output on the output pins DQ[0:15], as indicated by DATA-OUT (2) in FIG. 4. The burst counter 52 provides a third column address to column decoders 22 on the third falling edge of the $\overline{CAS}$ signal, and so on, until an entire row of data is read on the output pins DQ[0:15].

Thus, after the first column address is latched from input pins A0–A8, all subsequent column addresses are internally generated by the burst counter 52. Accordingly, the burst counter 52 allows an entire row of data to be accessed using a single set of externally generated row and column addresses and, therefore, eliminates the access time $\tau_{AA}$ for the second and all subsequent column addresses associated with a selected row. Thus, burst mode operation allows the second and all subsequent data of a selected row to be accessed at a much faster rate, as compared to the operation of the DRAM 10 (FIG. 1). However, since burst mode operation improves only the accessing speed of the second and subsequent data of a selected row, the access time $\tau_{AA}$ of the first column address remains and, as overall cycle time improves, begins to dominate the overall cycle time of DRAM. Moreover, burst mode operation does not allow data within a selected row to be randomly accessed. Thus, it would be advantageous to reduce or even eliminate the access time $\tau_{AA}$ of the first column address of a DRAM while preserving the ability to randomly access data within a selected row of memory.

SUMMARY

A novel memory address accessing technique is disclosed herein which allows faster access times to be achieved with minimal increases in cost and silicon die area. In accordance with the present invention, a DRAM includes a data input buffer having a first input terminal coupled to data I/O pins, a second input terminal coupled to a column address buffer, a third input terminal coupled to a column address strobe ($\overline{CAS}$) buffer, and an output terminal coupled to a column decoder. When reading a selected cell of the DRAM, the first row address and the first column address are latched on the falling edge of the row address strobe ($\overline{RAS}$) signal from the address input pins into a row address buffer and from the I/O pins into the data input buffer, respectively, of the DRAM. While the row address is decoded and used to select a row of memory cells of the DRAM, the column address is decoded and used to select one of the cells from the selected row. Data corresponding to the selected cell is forwarded to the I/O pins on the first falling edge of the $\overline{CAS}$ signal. By latching both the first row address and the first column address on the falling edge of the $\overline{RAS}$ signal, the access time $\tau_{AA}$ of the first column address is hidden, thereby allowing DRAMs in accordance with the present invention to realize superior speeds while preserving the ability to randomly access data within a selected row of the DRAM.

Like components in the Figures are similarly labeled.

DETAILED DESCRIPTION

Figure 5:
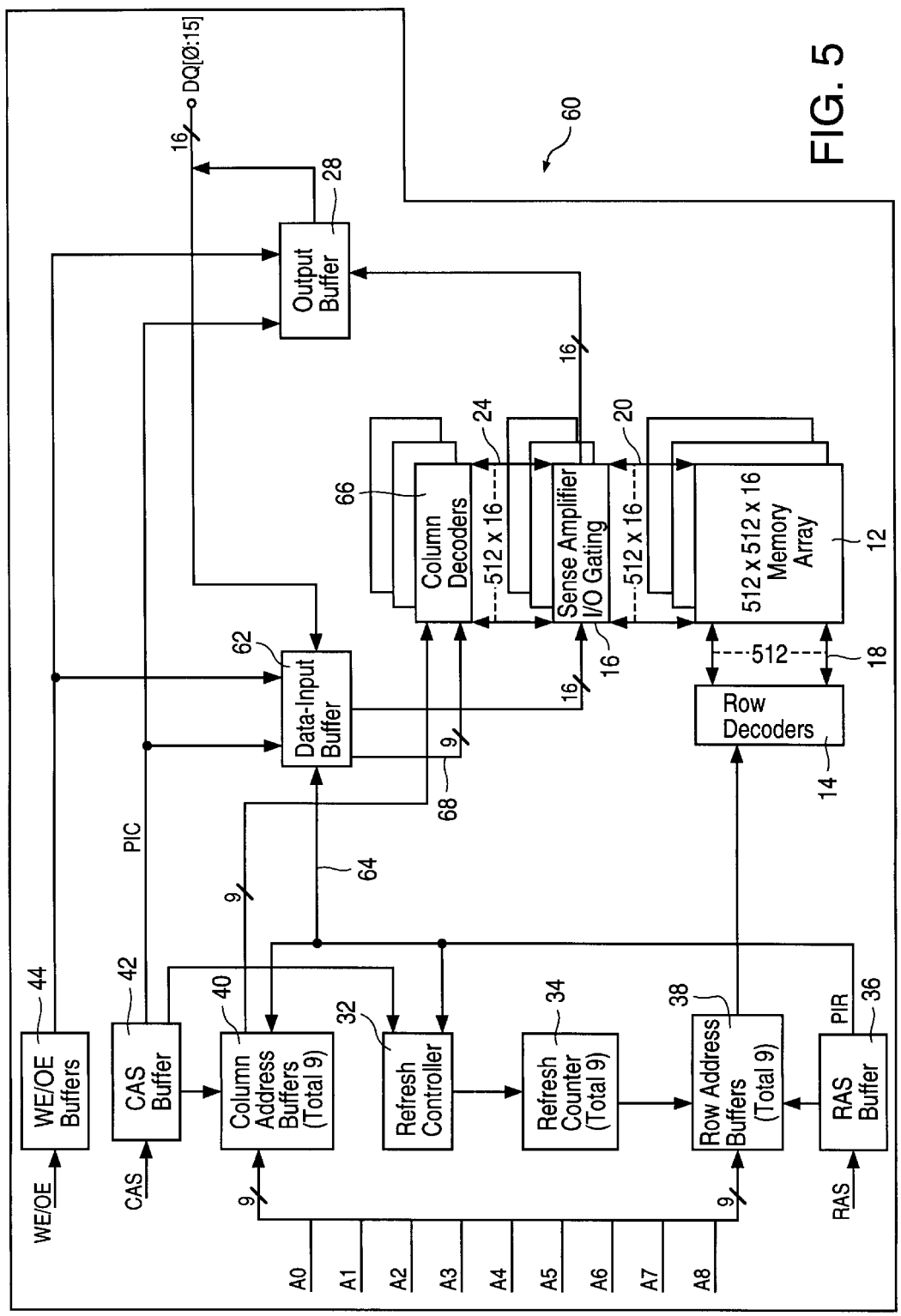
FIG. 5 is a block diagram of a DRAM in accordance with the present invention.

The present invention is described below in the context of a x16 EDO DRAM 60, as shown in FIG. 5. It is to be understood, however, that embodiments of the present invention are not limited to the specific example provided herein, but rather may be applied to other DRAMs which, for instance, have a greater or fewer number of cell arrays, or employ cell arrays of a different size than those employed by the DRAM 60.

In order to permit a DRAM to access memory cells in accordance with the present invention, the data input buffer and the column decoders of the DRAM are modified, as follows. Referring now to FIG. 5, a data input buffer 62 has an input terminal coupled to receive the $\overline{RAS}$ signal provided by $\overline{RAS}$ buffer 36 via line 64, and has an output terminal coupled to respective input terminals of the column decoders 66 via a bus 68. The bus 68 should be of a width equal to the number of input address pins. Thus, in the example shown in FIG. 5, where DRAM 60 includes 9 input address pins A0–A8, bus 68 is a 9-bit bus.

The memory cells within arrays 12 of DRAM 60 are initially selected for reading using an externally generated 18-bit address as follows, with reference also being made to the timing diagram of FIG. 6. The first 9 bits, which constitute the row address, are provided to input pins A0–A8 and the latter 9 bits, which constitute the column address are simultaneously provided to the data I/O pins DQ[0:15]. The row address and the column address are allowed to stabilize on the input address pins A0–A8 and the data I/O pins DQ[0:15], respectively, as indicated by $\tau_{ASR}$ in FIG. 6. On the falling edge of the $\overline{RAS}$ signal, the $\overline{RAS}$ buffer 36 communicates an internal row address strobe signal PIR to the row address buffers 38 and to the data input buffer 62, thereby latching the row address into the row address buffers 38 and latching the column address into the data input buffer 62, respectively. The row address is forwarded to the row decoders 14 which, in turn, drive a selected one of the word lines 18 to a high state in a well known manner. Data stored within the row of memory cells associated with the selected word line 18 is latched into corresponding sense amplifiers within the gating circuits 16 via the bit lines 20.

While the selected word line 18 is driven high, the data input buffer 62 forwards the column address received from the I/O pins DQ[0:15] to the column decoders 66 via the bus 68, and communicates a control signal to the gating circuits 16, thereby enabling the sense amplifiers within the gating circuits 16. The column decoders 18 then provide a decoded column address to the gating circuits 16 which, in turn, forward data stored in the sense amplifier selected by the decoded column address to the output buffer 28. The row address and the column address are held on the input address pins and A0–A8 and the I/O pins DQ[0:15], respectively, until the $\overline{RAS}$ signal stabilizes, as indicated by $\tau_{RAH}$ in FIG. 6.

Figure 6:
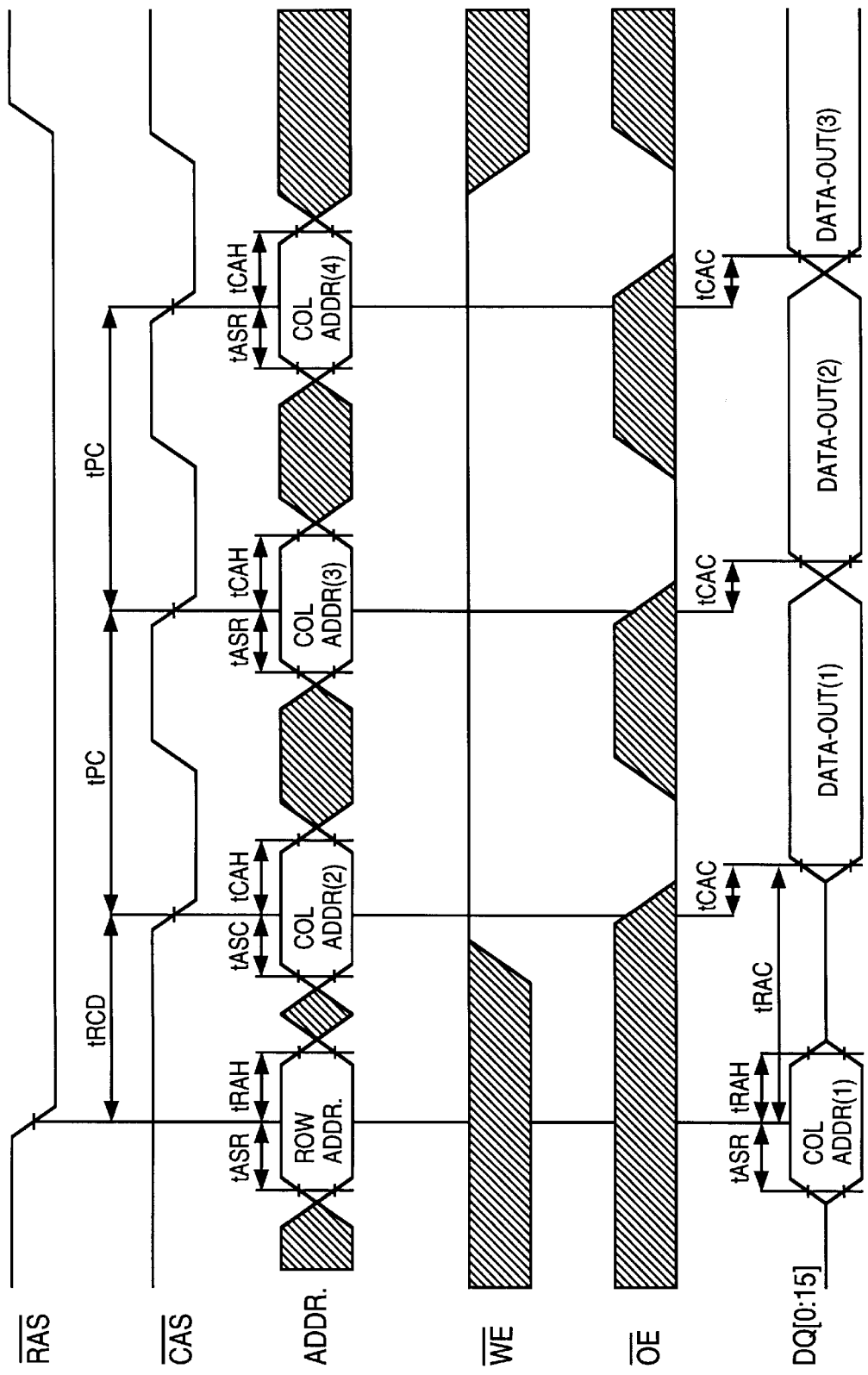
FIGS. 6 is a timing diagram illustrating a read operation of the DRAM of FIG. 5 in accordance with the present invention.

The second 9-bit column address is then provided to input address pins A0–A8, as indicated by COL ADDR (2), and allowed to stabilize, as indicated by $\tau_{ASC}$, in FIG. 6. On the falling edge of the $\overline{CAS}$ signal, the $\overline{CAS}$ buffer 42 communicates an internal column address strobe signal PIC to the output buffer 28, to the data input buffer 62, and to the column address buffers 40. In response to the PIC signal, data stored within the output buffer 28 is forwarded to the I/O pins DQ[0:15]. Thus, data stored within the cell selected by the first row address and the first column address appears as output data on the I/O pins DQ[0:15], as indicated by DATA-OUT (1) in FIG. 6, a time $\tau_{CAC}$ after the first falling edge of the $\overline{CAS}$ signal and a time $\tau_{RAC}$ after the first falling edge of the $\overline{RAS}$ signal, upon which the first row address and the first column address are latched into the row address buffers and the data input buffer 62, respectively.

The PIC signal also latches the second column address into the column address buffers 40 which, in turn, forward the column address to the column decoders 68. Note that the second column address is held on pins A0–A8 until the $\overline{CAS}$ signal stabilizes, as indicated by $\tau_{CAH}$. Data stored in the sense amplifier selected by the second column address is then forwarded, in a conventional manner, to the output buffer 28. This data will appear as the second output data on I/O pins DQ[0:15], as indicated by DATA-OUT (2), a time $\tau_{CAC}$ after the next falling edge of the $\overline{CAS}$ signal. Operation continues in the manner described above until all of the cells of the row selected by the externally generating row address ROW ADDR are read.

Figure 1:
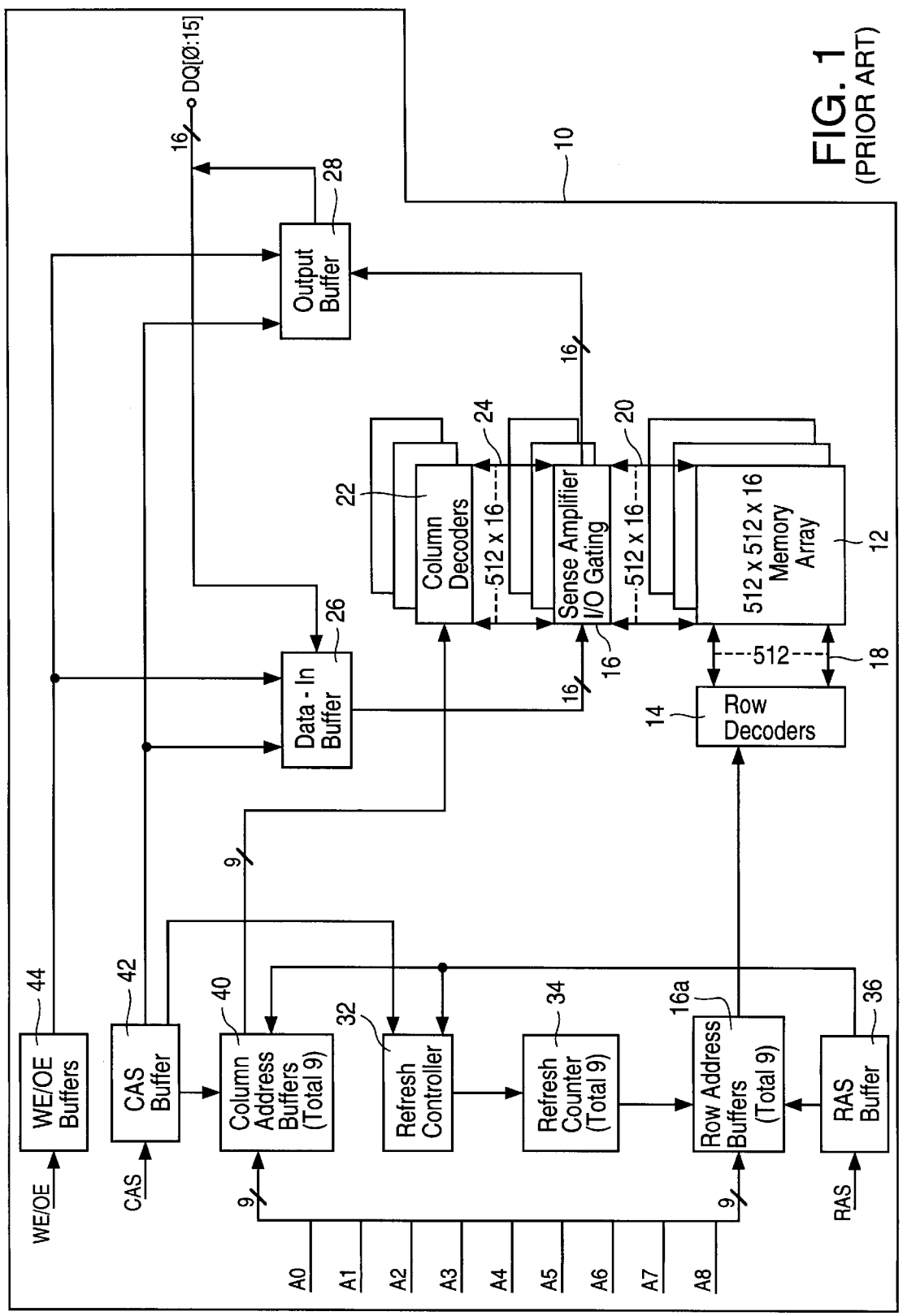
FIG. 1 is a block diagram of a conventional x16 EDO DRAM.
Figure 2:
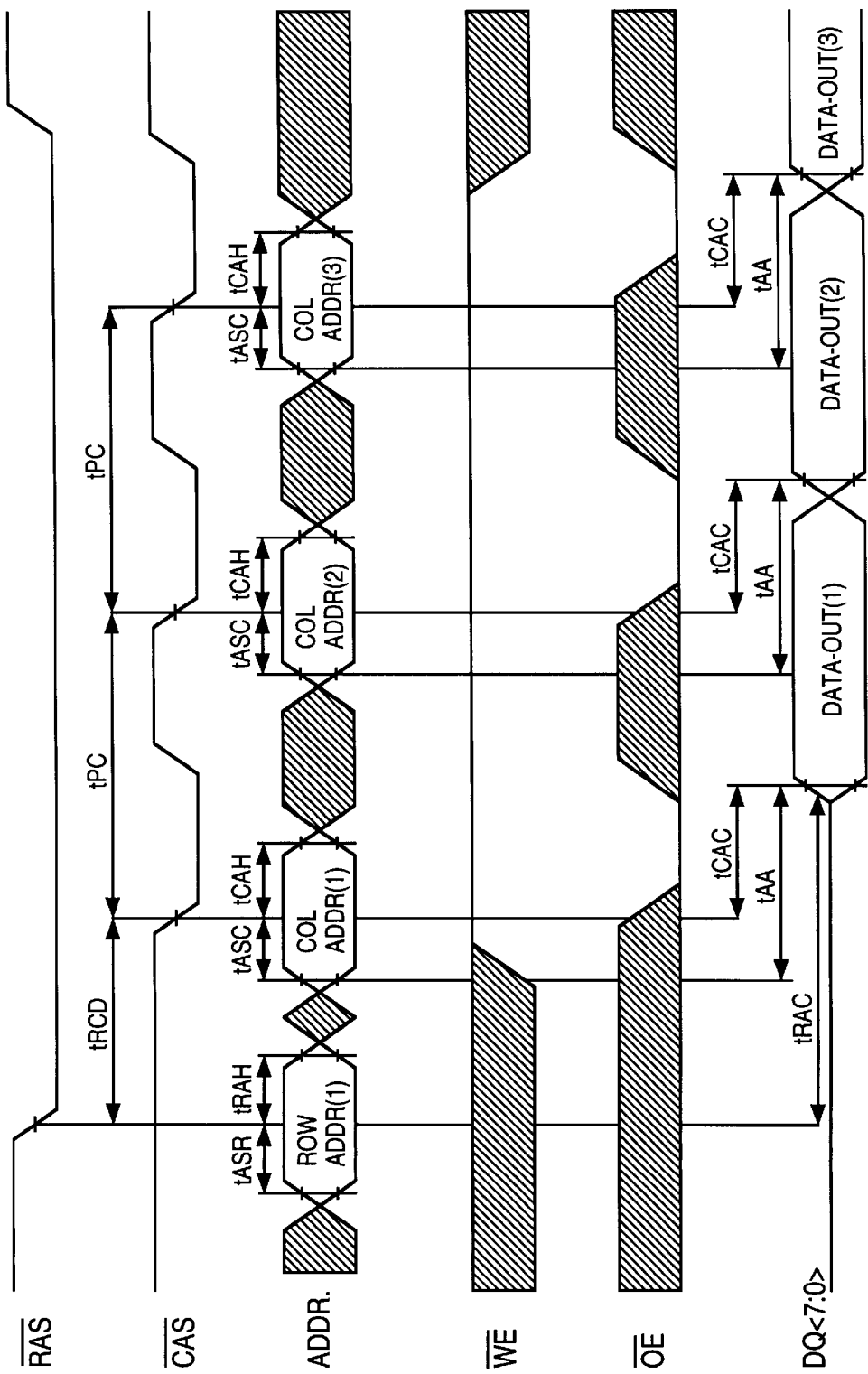
FIG. 2 is a timing diagram illustrating a read operation of the DRAM of FIG. 1.
Figure 3:
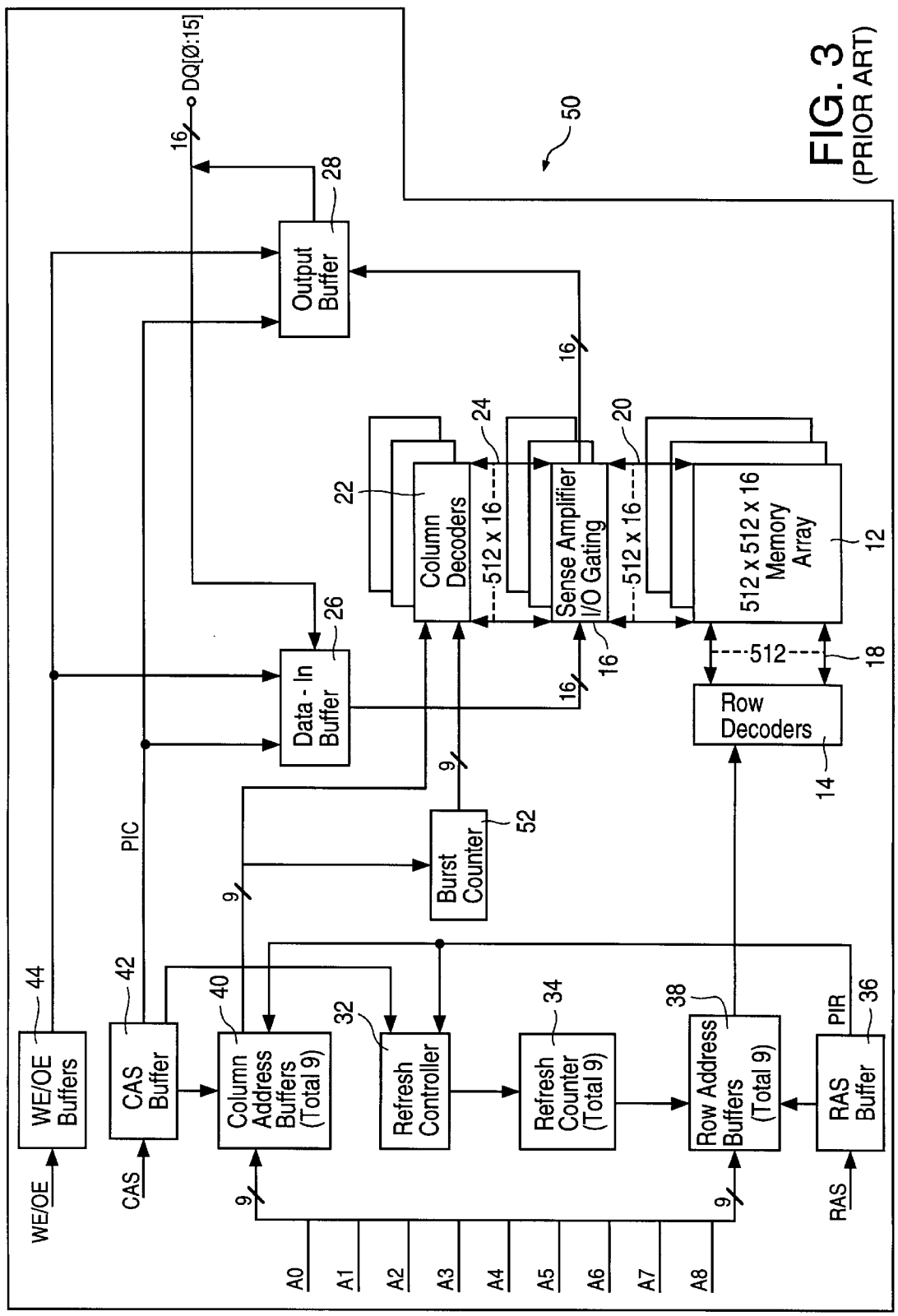
FIG. 3 is a block diagram of a conventional x16 EDO DRAM capable of operating in burst mode.
Figure 4:
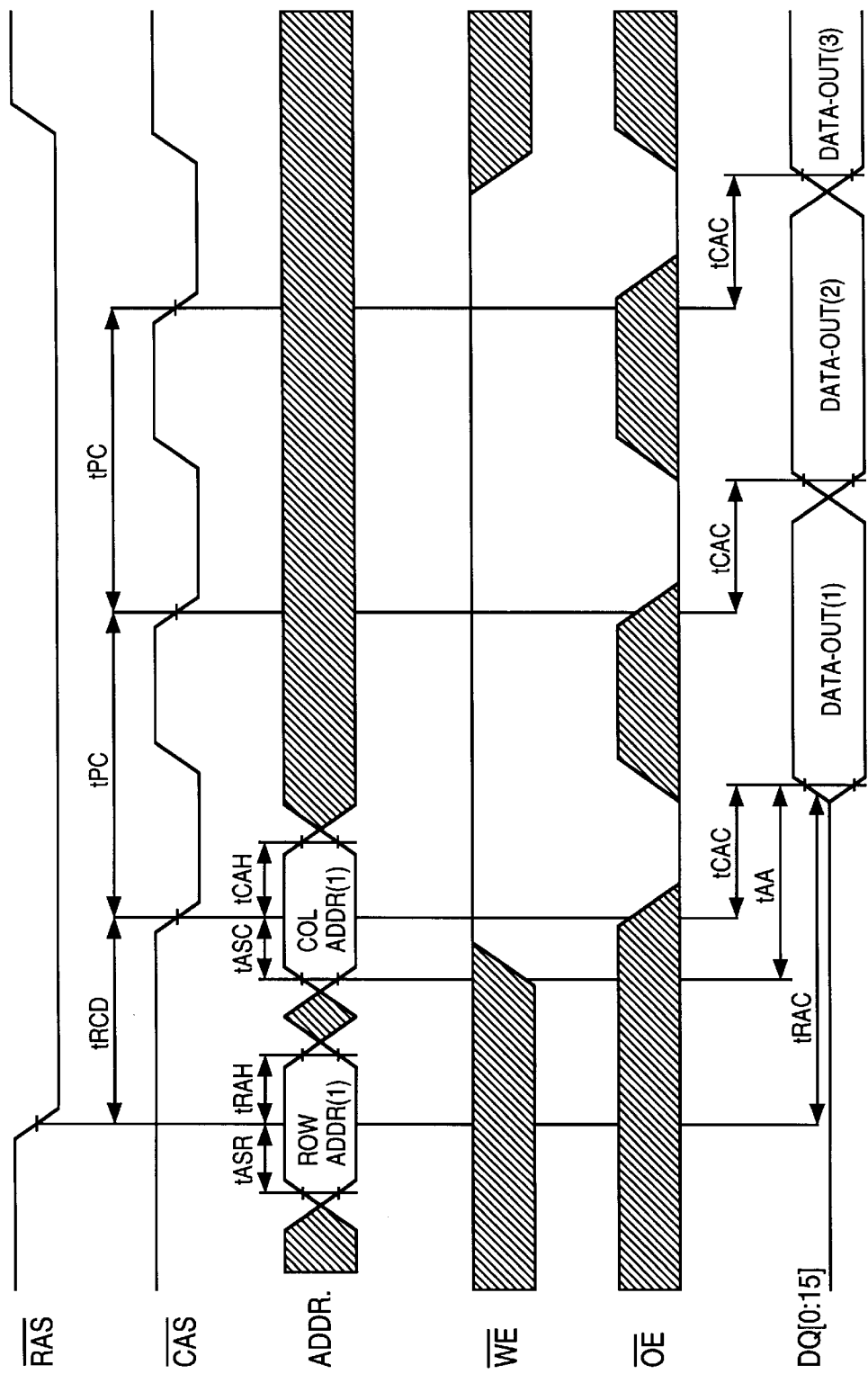
FIG. 4 is a timing diagram illustrating a read operation of the DRAM of FIG. 4 when operating in burst mode.

Embodiments of the present invention realize superior access compared to conventional DRAMs. Since both the first row address and the first column address are latched on the first falling edge of the $\overline{RAS}$ signal, the access time from the first column address is hidden (as indicated by the absence of $\tau_{AA}$ in the timing diagram of FIG. 6) and, therefore, does not contribute to the time required to read the first data. The access time of the DRAM 60 is thus measured from the falling edge of the $\overline{CAS}$ signal, i.e., $\tau_{CAC}$ (see FIG. 6), which in present embodiments is approximately 6 ns. In contrast, the access time of conventional DRAMs such as, for instance, DRAM 10 (FIG. 1), is measured from the time at which the first column address is provided to the input address pins A0–A8, i.e., $I_{AA}$ (see FIG. 2), which is typically 20 ns.

Applicant has found that accessing selected memory cells in accordance with the present invention allows DRAM 60 to achieve access speeds exceeding 100 MHz. As a result, DRAM 60, when employed, for instance, as the main memory of a computer system, significantly reduces the speed mismatch between main memory and the computer system's microprocessor, thereby advantageously increasing the data bandwidth of the microprocessor. Minimum values for the time delays associated with operating the DRAM 60, as denoted in the timing diagram of FIG. 6, are summarized below in Table 1.

TABLE 1

| delay | value |
| --- | --- |
| $\tau_{RCD}$ | 20 ns |
| $\tau_{PC}$ | 10 ns |
| $\tau_{RAC}$ | 50 ns |
| $\tau_{CAC}$ | 6 ns |
| $\tau_{ASR}$ | 0 |
| $\tau_{RAH}$ | 10 ns |
| $\tau_{ASC}$ | 0 |
| $\tau_{CAH}$ | 10 ns |

Figure 7:
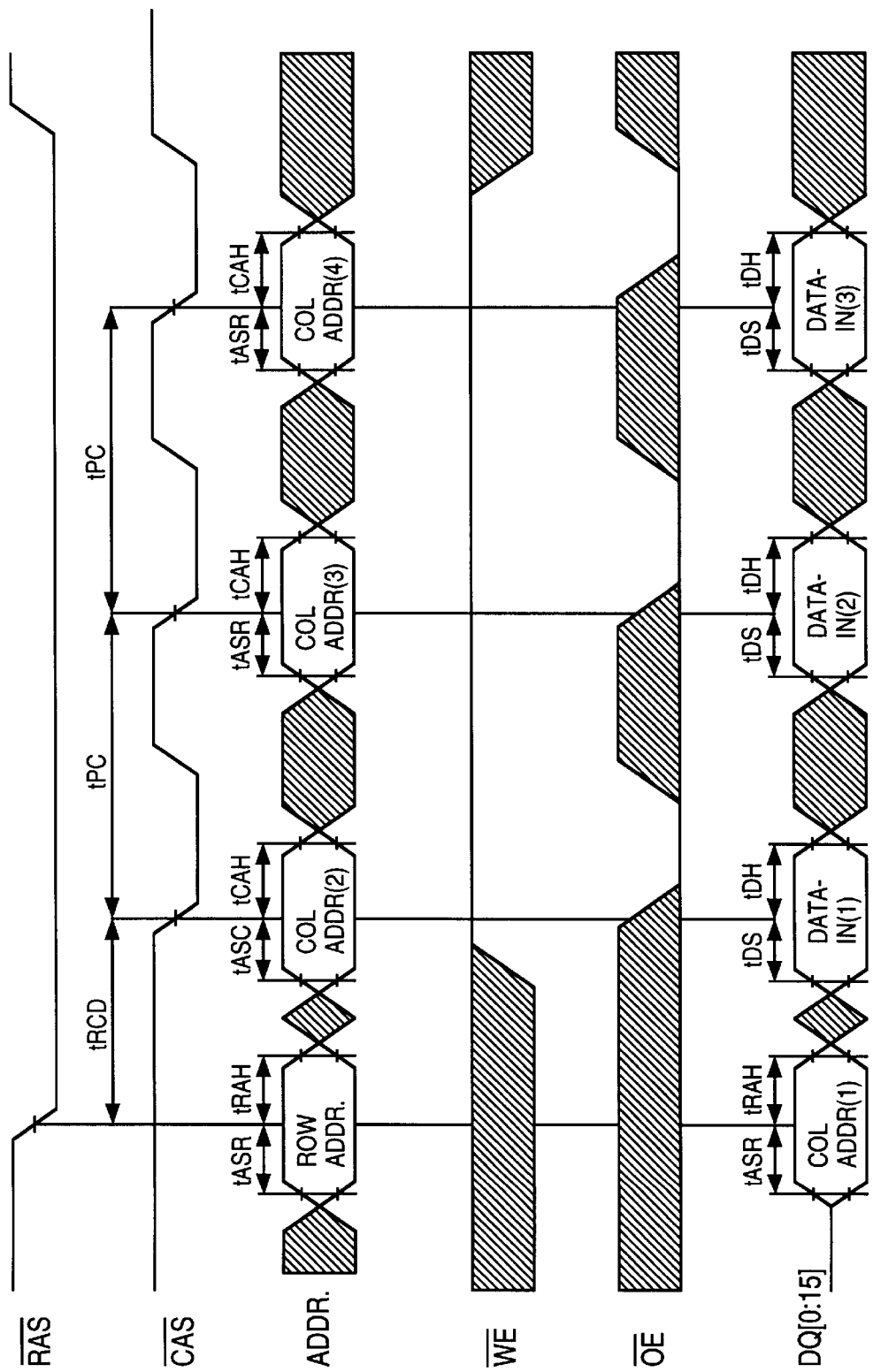
FIG. 7 is a timing diagram illustrating a write operation of the DRAM of FIG. 5 in accordance with the present invention.

In some embodiments, data is written to the cells of DRAM 60 in a conventional manner, as described above with respect to the DRAM 10 (FIG. 1). In preferred embodiments, however, data is written to one or more selected cells of the array 12 as follows, with reference to FIG. 7. The first row address, provided to the input address pins A0–A8, and the first column address, provided to the I/O pins DQ, are latched into the row address buffers 38 and the data input buffer 62, respectively, on the first falling edge of the $\overline{RAS}$ signal which, as discussed earlier, results in the assertion of the PIR signal. The first row address is decoded by the row decoders 14 which, in turn, cause the data within a selected row of cells to be latched into associated sense amplifiers within the gating circuit 16. The data input buffer 62 forwards the first column address to the column decoders 66 which, in turn, access one of the sense amplifiers selected by the column address. Input data, provided to the I/O pins DQ (as indicated by DATA-IN in FIG. 7), and the second column address, provided to the input address pins A0–A8, are latched into the data input buffer 62 and into the column address buffers 40, respectively, on the falling edge of the $\overline{CAS}$ signal. Data within the data input buffer 62 is then latched into the accessed sense amplifier, thereby writing the first data provided via I/O pins DQ into the selected sense amplifier. The second column address is forwarded to the column decoders 64 which, as described above, access a second selected one of the sense amplifiers. Subsequent column addresses and associated input data are latched on each successive falling edge of the $\overline{CAS}$ signal until an entire row of data is written to the memory cells of the DRAM 60. Data stored within the sense amplifiers is written into the cells of the selected row during a subsequent write operation.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A method for accessing a selected cell of a DRAM having input address pins and data I/O pins, said method comprising:

(a) providing a row address of said selected cell to said input address pins;

(b) providing a column address of said selected cell to said data I/O pins;

(c) latching said row address and said column address into a row address buffer and a data input buffer, respectively, on a predetermined edge of a row address strobe signal; and (d) accessing said selected cell using said row address and said column address.

2. The method of claim 1, wherein during reading operations of said DRAM the step (d) further comprises:

(d1) decoding said row address using a row decoder to generate a decoded row address;

(d2) decoding said column address using a column decoder to generate a decoded column address;

(d3) latching data from a row of cells selected by said decoded row address into a plurality of sense amplifiers; and (d4) reading the data from one of said plurality of sense amplifiers, selected using said decoded column address, onto said data I/O pins.

3. The method of claim 2, wherein the data is provided to said data I/O pins on a predetermined edge of a column address strobe signal.

4. The method of claim 1, wherein during writing operations of said DRAM, the step (d) further comprises:

(d1) decoding said row address using a row decoder to generate a decoded row address;

(d2) decoding said column address using a column decoder to generate a decoded column address;

(d3) latching data from a row of cells selected by said decoded row address into a plurality of sense amplifiers; and (d4) writing the data to be written into said selected cell into one of said plurality of sense amplifiers selected using said decoded column address.

5. The method of claim 4, further comprising the step of:

(e) writing the data to be written into said selected cell into said selected cell during a write operation of the DRAM.

6. A DRAM comprising:

an array of memory cells;

a plurality of input address pins;

a plurality of data I/O pins;

a data input buffer having a first input port coupled to said data I/O pins, a second input port coupled to receive a row address strobe signal, and an output port; and a column decoder having an input port coupled to said output port of said data input buffer, wherein a first row address and a first column address provided at said plurality of input address pins and said plurality of data I/O pins, respectively, are latched into said DRAM on a first predetermined edge of said row address strobe.

7. The DRAM of claim 6, further comprising:

a row address buffer having an input port coupled to said input address pins;

a column address buffer having an input port coupled to said input address pins and having an output port coupled to a second input port of said column decoder;

a row decoder having an input port coupled to an output port of said row address buffer and having an output port coupled to respective word lines of said array of memory cells; and a plurality of sense amplifiers each having a first port coupled to an associated port of said column decoder and having a second port coupled to a respective one of a plurality of bit lines of said array of memory cells.

* * * * *